United States Patent
Qu et al.

(10) Patent No.: US 9,082,628 B2
(45) Date of Patent: Jul. 14, 2015

(54) TRENCH SCHOTTKY DIODE

(75) Inventors: Ning Qu, Reutlingen (DE); Alfred Goerlach, Kusterdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 13/984,604

(22) PCT Filed: Dec. 14, 2011

(86) PCT No.: PCT/EP2011/072798
§ 371 (c)(1),
(2), (4) Date: Oct. 22, 2013

(87) PCT Pub. No.: WO2012/107135
PCT Pub. Date: Aug. 16, 2012

(65) Prior Publication Data
US 2014/0035090 A1 Feb. 6, 2014

(30) Foreign Application Priority Data
Feb. 11, 2011 (DE) .................. 10 2011 003 961

(51) Int. Cl.
*H01L 29/47* (2006.01)
*H01L 29/06* (2006.01)
*H01L 29/36* (2006.01)
*H01L 29/872* (2006.01)

(52) U.S. Cl.
CPC ........... *H01L 29/0615* (2013.01); *H01L 29/36* (2013.01); *H01L 29/872* (2013.01); *H01L 29/8725* (2013.01)

(58) Field of Classification Search
CPC .............................. H01L 29/872; H01L 29/06
USPC ............ 257/29.335, E29.338, 471, 475, 476, 257/481
See application file for complete search history.

(56) References Cited

U.S. PATENT DOCUMENTS

| | | | | |
|---|---|---|---|---|
| 5,262,668 A * | 11/1993 | Tu et al. | | 257/475 |
| 6,049,108 A * | 4/2000 | Williams et al. | | 257/341 |
| 6,078,090 A * | 6/2000 | Williams et al. | | 257/476 |
| 2002/0125541 A1 | 9/2002 | Korec et al. | | |
| 2005/0287744 A1* | 12/2005 | Ono et al. | | 438/270 |
| 2008/0083966 A1 | 4/2008 | Oonishi | | |
| 2008/0197439 A1* | 8/2008 | Goerlach et al. | | 257/476 |

FOREIGN PATENT DOCUMENTS

| | | |
|---|---|---|
| DE | 102004053761 | 5/2006 |
| WO | WO02099869 | 12/2002 |

* cited by examiner

*Primary Examiner* — Steven Loke
*Assistant Examiner* — Arash Majdi
(74) *Attorney, Agent, or Firm* — Kenyon & Kenyon LLP

(57) ABSTRACT

A trench Schottky diode is described, which has a highly doped substrate of a first conductivity type and an epitaxial layer of the same conductivity type that is applied to the substrate. At least two trenches are introduced into the epitaxial layer. The epitaxial layer is a stepped epitaxial layer that has two partial layers of different doping concentrations.

5 Claims, 3 Drawing Sheets

TRENCH SCHOTTKY DIODE

FIELD OF THE INVENTION

The present invention relates to a trench Schottky diode.

BACKGROUND INFORMATION

It is generally known to use p-n diodes as Zener diodes in motor vehicle generator systems. The advantages of using such p-n diodes reside, in particular, in that, on the one hand, they have a low reverse current and, on the other hand, are highly rugged. A disadvantage of using such p-n diodes is the high forward voltage UF thereof. At room temperature, the current does not begin to flow until UF=0.7 V. Under normal operating conditions, for example, at a current density of 500 A/cm², the forward voltage rises to over 1 V. This signifies a considerable loss in the efficiency of a motor vehicle generator.

Schottky diodes are an alternative to p-n diodes. Such Schottky diodes have a significantly lower forward voltage than p-n diodes, for example, 0.5 V to 0.6 V at a high current density of 500 A/cm². Moreover, as majority carrier components, Shottky diodes offer advantages for a rapid switching operation. Simple Schottky diodes are not particularly suited for motor vehicle generator systems. This is attributable to several important drawbacks of Schottky diodes, in particular to the higher reverse current thereof in comparison to p-n diodes, to the heavy dependency of the reverse current thereof on the reverse voltage, and to the insufficient ruggedness thereof, in particular at high temperatures.

Improved Schottky diodes have also been already provided.

A trench MOS barrier Schottky diode (TMBS) is an improved Schottky diode. FIG. 1 shows a sectional view of this type of known TMBS that is preferably realized in the form of a chip. A TMBS has an n⁺ substrate 1, an n-epitaxial layer 2, at least two trenches 6 realized in the n-epitaxial layer by etching, a metal layer 4 at the front side of the chip as an anode electrode, a metal layer 5 at the rear side of the chip as a cathode electrode and dielectric layers 7 between trenches 6 and metal layer 4. Dielectric layers 7 are oxide layers, for example. From an electrical standpoint, a TMBS is a combination of an MOS structure, to which metal layer 4, oxide layers 7, and n-epitaxial layer 2 belong, and a Schottky diode, which is formed by the Schottky barrier that is present between metal layer 4 as an anode and n-epitaxial layer 2 as a cathode.

In the forward direction of a TMBS, currents flow through the mesa regions between trenches 6. Trenches 6 are not available for the current flow. Therefore, in the case of a TMBS, the effective surface for the current flow in the forward direction is smaller than in the case of a conventional planar Schottky diode.

An important advantage of a TMBS resides in the reduction of the reverse currents. Both in the case of the MOS structure, as well as in the case of the Schottky diode, space charge zones form in the reverse direction. The space charge zones expand in response to increasing voltage and, at a voltage that is lower than the breakdown voltage of the TMBS, collide in the middle of the region between adjacent trenches 6. This shields the Schottky effects responsible for the high reverse currents, thereby reducing the reverse currents. This shielding effect is heavily dependent on the structural parameters Dt (depth of the trench), Wm (distance between the trenches), Wt (width of the trench), as well as on To (thickness of the oxide layer).

A disadvantage of a TMBS, particularly in the case of a TMBS having a lower barrier height, is the round, respectively soft reverse characteristic. This means that, already well before the actual breakdown, that occurs, for example, at a voltage of 70-80% of the breakdown voltage, the reverse current already rises markedly and is significantly greater than the reverse current at a lower voltage. This substantial reverse current in the pre-breakdown of the Schottky diode induces a substantial power loss, especially at high temperatures, and can lead to thermal instability and to failure of the component as the result of a positive electrical-thermal feedback.

Another improved Schottky diode is a trench Schottky barrier Schottky diode (TSBS). FIG. 2 shows a sectional view of this type of known TSBS that is preferably realized in the form of a chip. A TSBS has an n⁺ substrate 1, an n-epitaxial layer 2, at least two trenches 6 realized in n-epitaxial layer 2 by etching, and a metal layer 5 at the rear side of the chip as an ohmic contact, respectively cathode electrode. Trenches 6 are first partially filled with a metal 4b having a thickness Dm1 and subsequently covered with a second metal 4a. Second metal 4a fills the remainder of the trenches to a thickness of Dm2. Both metals 4a and 4b at the front side of the chip are used as Schottky contacts, respectively as an anode electrode.

Second metal 4a typically has a lower barrier height than first metal 4b. Therefore, from an electrical standpoint, the TSBS is a combination of two Schottky diodes having different barrier heights: one Schottky diode having a Schottky barrier between metal 4b as an anode and n-epitaxial layer 2 as a cathode, and a second Schottky diode having a Schottky barrier between metal 4a as an anode and n-epitaxial layer 2 as a cathode.

The currents flow in the forward direction at least when the barrier heights of the two metals are distinctly different, mainly to upper metal 4a having the lower barrier, also at the corresponding side walls of the trenches. Therefore, in the case of a TSBS, the effective surface for the current flow in the forward direction can be greater than in the case of a conventional planar Schottky diode.

In the reverse direction, first metal 4b, with the greater barrier height thereof, provides for a large expansion of the space charge zones. The space charge zones expand in response to increasing voltage and, at a voltage that is lower than the breakdown voltage of the TSBS, collide in the middle of the region between adjacent trenches 6. This shields the Schottky effects responsible for the high reverse currents, thereby reducing the reverse currents. This shielding effect is heavily dependent on structural parameters Dt (depth of the trench), Wm (distance between the trenches), Wt (width of the trench), as well as Dm1 (thickness of first metal 4b).

An advantage of a TSBS is the combination of both metals, which allows a certain separation of the structures with respect to the requirements of the forward voltage and shielding behavior. Forward voltage UF and the initial value of reverse current IR0 are predominantly influenced by second metal 4a having a lower barrier. The greater the proportion of second metal 4a is, the lower is UF, and all the higher is IR0. On the other hand, first metal 4b having a greater barrier determines the voltage dependency of the reverse current, the breakdown voltage, and the current distribution at high reverse currents. For that reason, the TSBS offers an optimization possibility by combining the two metals. Both thicknesses Dm1 and Dm2, as well as the barrier heights of the two metals may be used as parameters.

As in the case of the TMBS, a disadvantage of the TSBS is the round, respectively soft reverse characteristic.

Another improved Schottky diode is a trench junction barrier Schottky diode (TJBS). A sectional view of a TJBS of this type is shown in FIG. 3. A TJBS has an $n^+$ substrate 1, an n-epitaxial layer 2, at least two trenches 6 etched into n-epitaxial layer 2, a metal layer 4 at the front side of the chip as an anode electrode, and a further metal layer 5 at the rear side of the chip as a cathode electrode. Trenches 6 are filled with p-doped silicon or polysilicon.

From an electrical standpoint, the TJBS is a combination of a p-n diode (p-n transition between the p-doped silicon or polysilicon as an anode and an n-epitaxial layer 2 as a cathode) and a Schottky diode (Schottky battier between metal layer 4 as an anode and n-epitaxial layer 2 as a cathode).

In the forward direction, currents flow only through the Schottky diode. However, due to the lacking lateral p-diffusion, similarly to the TMBS, the effective surface for the current flow in the forward direction in the case of the TJBS is significantly greater than in the case of a conventional junction barrier Schottky diode.

In the reverse direction, the space charge zones expand in response to increasing voltage and, at a voltage that is lower than the breakdown voltage of the TJBS, collide in the middle of the region between adjacent trenches 6. This shields the Schottky effect responsible for the high reverse currents, thereby reducing the reverse currents. This shielding effect is heavily dependent on structural parameters Dt (depth of the trench), Wn (distance between the trenches), as well as Wp (width of the trench).

The TJBS can provide a substantial ruggedness due to the clamping function thereof when the breakdown voltage of p-n diode 8-2 is dimensioned to be lower than that of Schottky diode 4-2, and the breakdown takes place at the bottom of the trenches. In breakdown operation, the reverse current flows then only through the p-n junction. Thus, forward direction and reverse direction are geometrically separate. Therefore, the ruggedness of the TJBS is similar to that of a p-n diode.

If the breakdown voltage of p-n diode 8-2 is significantly lower than that of Schottky diode 4-2, then the TJBS can significantly reduce the voltage dependency of the leakage currents caused by the Schottky effect, and exhibit a square reverse characteristic.

German Published Patent Application No. 10 2004 053 761 describes a TJBS of this kind having an integrated p-n diode, as well as a method for manufacturing such a TJBS.

SUMMARY

In contrast, a trench Schottky diode according to the present invention has the advantage of having a reduced voltage dependency of the leakage currents due to the stepped epitaxial layer thereof and of being able to be reliably operated, even in the event of voltage breakdown. This last mentioned operating mode is especially necessary for a load dump protection for a use in motor vehicle generators.

A trench Schottky diode in accordance with the present invention features a stepped epitaxial layer that encompasses two differently doped partial layers. In this context, the lower partial layer, which is contacted by the highly doped substrate, has a significantly higher doping than the top partial layer, which is spaced apart from the highly doped substrate. The lower partial layer determines the breakdown voltage of the trench Schottky diode and acts as a clamping element. The lower layer is preferably dimensioned to allow the breakdown voltage of the trench Schottky diode to be significantly lower than that of the Schottky diode in the chip surface region, and the trench Schottky diode to exhibit a square reverse characteristic.

In comparison to a conventional TMBS and a conventional TSBS, a trench Schottky diode in accordance with the present invention features a reduced voltage dependency of the leakage currents and a greater stability due to the clamping function of the stepped epitaxial layer. This makes a trench Schottky diode in accordance with the present invention especially suited for a use as a Zener diode in motor vehicle generator systems.

In comparison to a conventional TJBS, a trench Schottky diode in accordance with the present invention provides another option for realizing an integrated clamping function.

Exemplary embodiments of a trench Schottky diode in accordance with the present invention are clarified in the following with reference to FIG. 4-6, which show:

DETAILED DESCRIPTION

Figure 4:
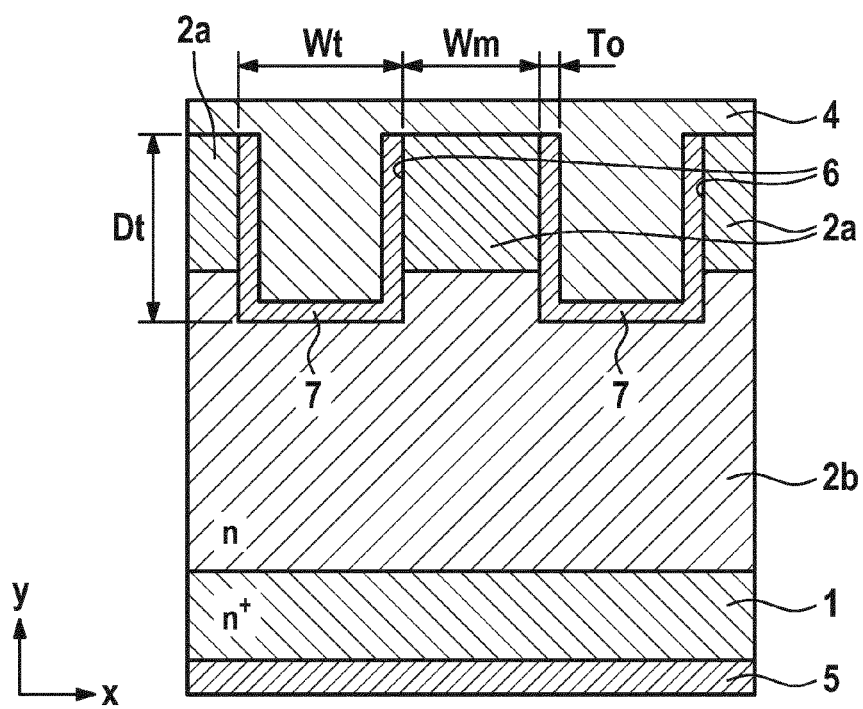
FIG. 4 shows a sectional view of a trench MOS barrier Schottky diode in accordance with the present invention.

FIG. 4 shows a sectional view of a trench MOS barrier Schottky diode TMBS in accordance with the present invention.

The TMBS illustrated in FIG. 4 features an $n^+$ substrate 1, a first n-epitaxial partial layer 2b, a second n-epitaxial layer 2a, at least two trenches 6, which are etched into n-epitaxial partial layers 2a and 2b and have a width Wt, a depth Dt and a distance Wm between adjacent trenches, a metal layer 4 at the front side of the chip as an anode electrode, a metal layer 5 at the rear side of the chip as a cathode electrode and oxide layers 7 having a thickness To at the surface of trenches 6.

In contrast to a conventional TMBS, in the case of a TMBS in accordance with the present invention, the n-epitaxial layer of the TMBS structure is not realized using a uniform doping concentration, rather is divided in the vertical direction into two partial layers having different doping concentrations. Upper partial layer 2a allows a higher breakdown voltage of the Schottky diode at surface 4-2a and is weakly doped. Lower partial layer 2b, in whose region, the lower region of etched trenches 6 is located, has a higher doping concentration. The breakdown voltage of the MOS structure, to which metal layer 4, oxide layers 7, and upper partial layer 2a belong and, consequently, also the breakdown voltage of the entire TMBS, is determined by lower partial layer 2b and is, therefore, lower than the breakdown voltage of the Schottky diode at surface 4-2a.

If, in the case of a TMBS of this kind, which has a stepped epitaxial layer, the breakdown voltage of MOS structure 4, 7, 2b is significantly lower than that of Schottky diode 4, 7, 2a, for example, 50% of that of the Schottky diode, then the TMBS exhibits a square reverse characteristic. This means that the pre-breakdown of the Schottky diode of a conventional TMBS no longer takes place, and the round, respectively soft reverse characteristic of the Schottky diode at the surface is cut off by the lower breakdown voltage of the MOS structure. Consequently, the TMBS having a stepped epitaxial layer in accordance with the present invention has a clamping function that is determined by the MOS structure having lower partial layer 2b of a higher doping concentration. This enhances the ruggedness of the component and is advantageous for a load dump protection in the case of a use for motor vehicle generators.

Figure 5:
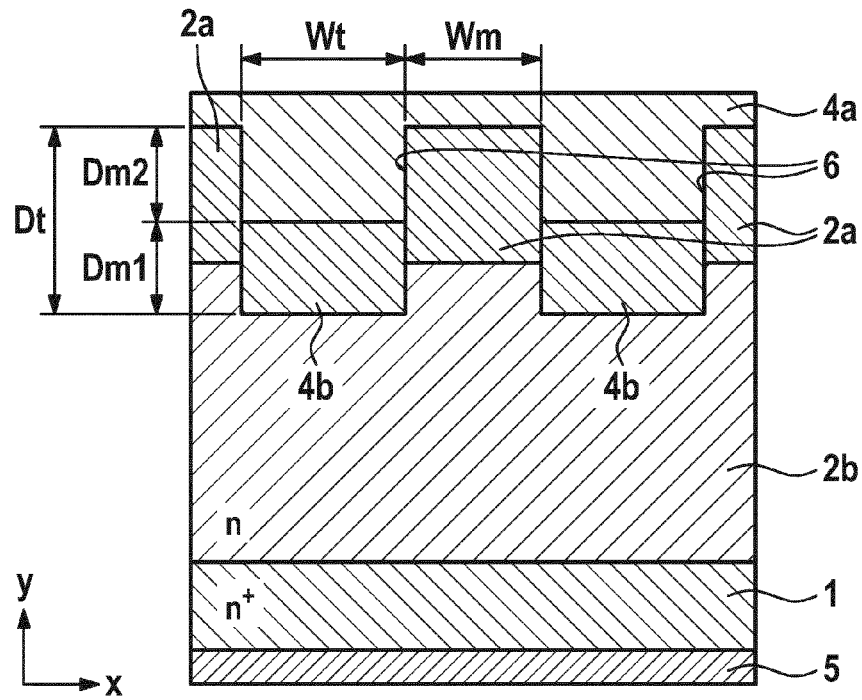
FIG. 5 shows a sectional view of a trench Schottky barrier Schottky diode in accordance with the present invention.

FIG. 5 shows a sectional view of a trench Schottky barrier Schottky diode TSBS in accordance with the present invention.

The TSBS illustrated in FIG. 5 features an n+ substrate 1, a first n-epitaxial partial layer 2b, a second n-epitaxial layer 2a, at least two trenches 6, which are etched into n-epitaxial partial layers 2a and 2b and have a metal layer 5 at the rear side of the chip as an ohmic contact, respectively cathode electrode. Trenches 6 are first partially filled with a metal 4b having a thickness Dm1 and subsequently covered with a second metal 4a. Second metal 4a fills the remainder of the trenches to a thickness of Dm2. Both metals 4a and 4b at the front side of the chip are used as Schottky contacts, respectively as an anode electrode.

Similarly to the TMBS in accordance with the present invention shown in FIG. 4, the n-epitaxial layer of the TSBS structure is divided in the vertical direction into two partial layers 2a and 2b having different doping concentrations. Upper partial layer 2a allows a higher breakdown voltage of the Schottky diode at surface 4-2a and is weakly doped. Lower partial layer 2b, in which the lower region of etched trenches 6 is located, has a higher doping concentration and, therefore, a lower breakdown voltage. Consequently, the breakdown voltage of the entire TSBS is determined by lower partial layer 2b.

If, in the case of a TSBS of this kind, which has a stepped epitaxial layer, the breakdown voltage of the lower region is significantly lower than that of the Schottky diode at the surface, for example, 50% of that of the Schottky diode, then the TSBS exhibits a square reverse characteristic. This means that the pre-breakdown of the Schottky diode of a conventional TSBS no longer takes place, and the round, respectively soft reverse characteristic of the Schottky diode at the surface is cut off by the lower breakdown voltage of the lower Schottky structure. Consequently, the TSBS having a stepped epitaxial layer in accordance with the present invention features a clamping function that is determined by the lower Schottky structure having lower partial layer 2b of higher doping concentration. This enhances the ruggedness of the component and is advantageous for a load dump protection in the case of a use for motor vehicle generators.

Figure 6:
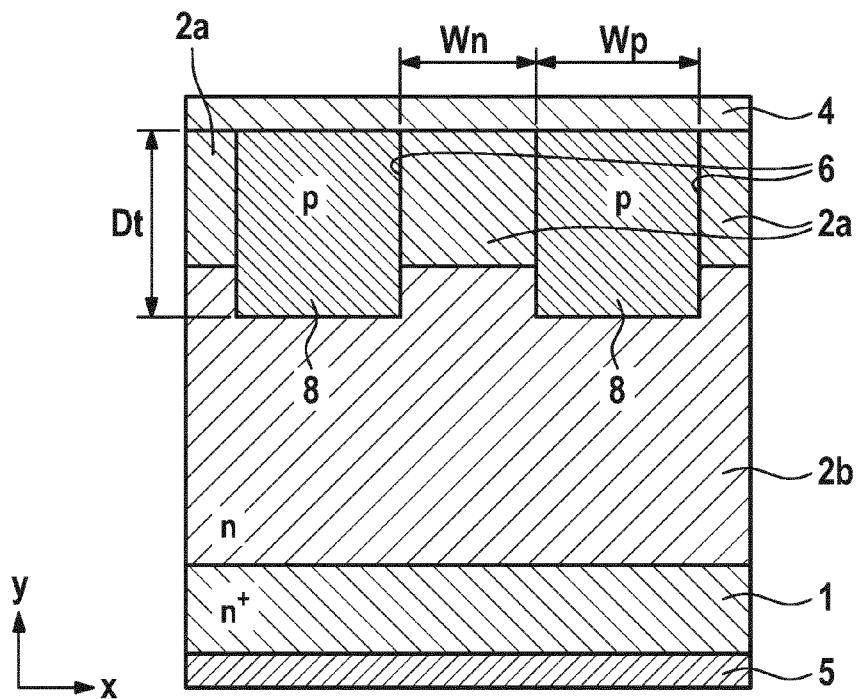
FIG. 6 shows a sectional view of a trench junction barrier Schottky diode in accordance with the present invention.

FIG. 6 shows a sectional view of a trench junction barrier Schottky diode TJBS in accordance with the present invention.

The TJBS illustrated in FIG. 6 features an n+ substrate 1, a first n-epitaxial partial layer 2b, a second n-epitaxial partial layer 2a, at least two trenches 6, which are etched into n-epitaxial partial layers 2a and 2b and have a metal layer 5 at the rear side of the chip as a cathode electrode, and a metal layer 4 at the front side of the chip as an anode electrode. Trenches 6 are filled with p-doped material, preferably p-doped silicon or p-doped polysilicon 8.

Figure 1:
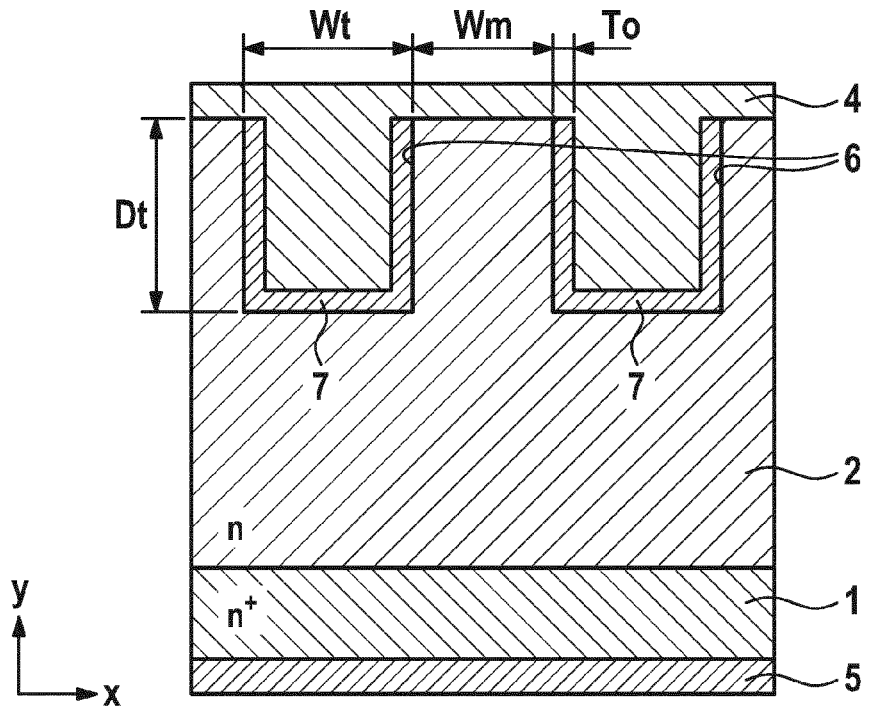
FIG. 1 shows a sectional view of a known trench MOS barrier Schottky diode (TMBS).
Figure 2:
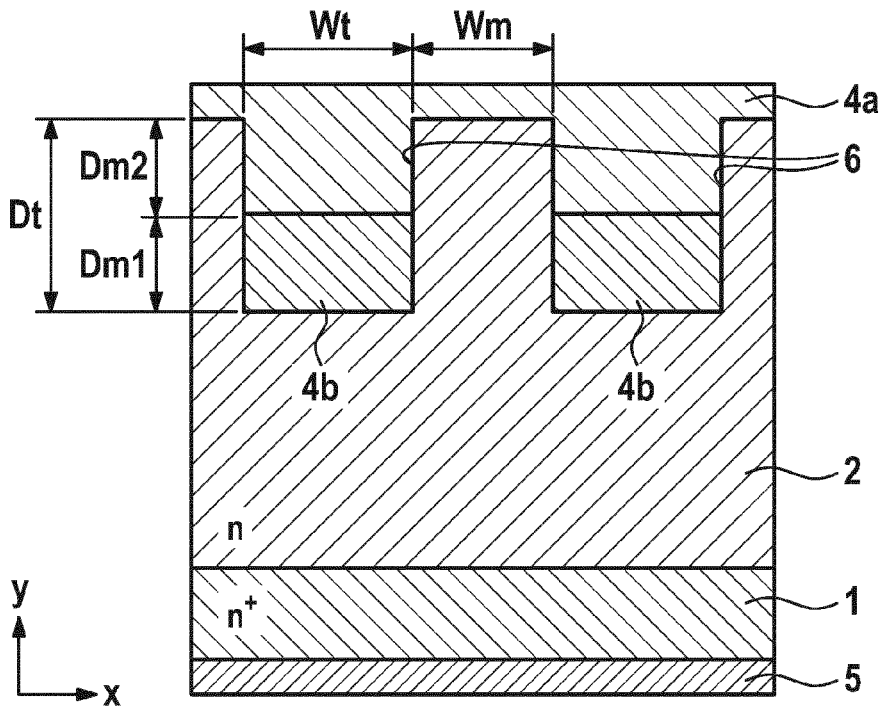
FIG. 2 shows a sectional view of a known trench Schottky barrier Schottky diode (TSBS).
Figure 3:
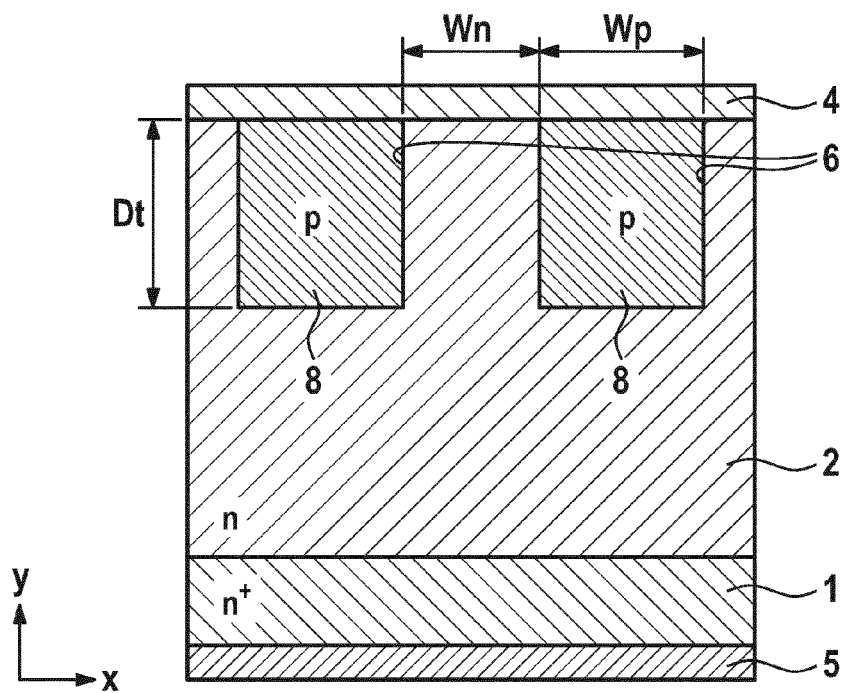
FIG. 3 shows a sectional view of a trench junction barrier Schottky diode (TJBS).

In contrast to the TJBS shown in FIG. 3, the n-epitaxial layer is divided from top to bottom into two partial layers 2a and 2b of different doping concentrations. Upper partial layer 2a allows a higher breakdown voltage of the Schottky diode at the surface and is weakly doped. Lower partial layer 2b, in which the lower regions of etched trenches 6 is located, has a higher doping concentration and, therefore, a lower breakdown voltage. Consequently, the breakdown voltage of the entire TJBS is determined by the p-n junction between the p-doped silicon, respectively the p-doped polysilicon 8 and the lower partial layer 2b. Therefore, the stepped epitaxial layer described above makes it readily possible to realize the clamping function of a TJBS.

In the case of all of the exemplary embodiments described above, the semiconductor structures may have a solderable front- and rear-side metallization, which allows them to be readily fastened, respectively contacted in a suitable circuit environment. The described structures are preferably each mounted in a press-in diode housing. One preferred application of trench Schottky diodes in accordance with the present invention is a use in a rectifier of a motor vehicle generator.

Alternatively to the exemplary embodiments described above, all semiconductor layers may each be replaced by a semiconductor layer of an opposite conductivity type, and the designations of the anode and cathode connections may be interchanged.

In the case of Trench Schottky diodes in accordance with the present invention, additional structures may be provided in the edge region of the particular chip to reduce the edge-region field strength. In this context, it may be a question of lightly doped p-regions, of field plates or of similar known structures, for example.

As already noted, in accordance with the present invention, a trench Schottky diode is preferably realized as a chip, and has a breakdown voltage of the lower region that is between 40% and 60% of that in the chip surface region. The breakdown voltage thereof preferably resides within the range of between 20 V and 40 V. It may be operated at breakdown at current densities j, for which it holds that:

$$10^{-4} \text{ A/cm}^2 \leq j \leq 500 \text{ A/cm}^2.$$

What is claimed is:
1. A trench Schottky diode, comprising:
   a highly doped substrate of a first conductivity type;
   an epitaxial layer of the first conductivity type and applied to the substrate, wherein:
      the epitaxial layer includes at least two trenches,
      the epitaxial layer is a stepped epitaxial layer including a first partial layer and a second partial layer of different doping concentrations,
      the first partial layer is contacted by the substrate and includes a higher doping concentration than the second partial layer,
      the second partial layer is not contacted by the substrate,
      the first partial layer determines a breakdown voltage of the trench Schottky diode, and
      the trench Schottky diode is a trench Schottky barrier Schottky diode;
   a first metal layer disposed at a rear side and serving as a cathode electrode;
   a second metal layer disposed at a front side and extending into the trenches, the second metal layer serving as a control electrode and forming a first Schottky contact with the second partial layer; and
   a third metal layer disposed between the second metal layer and each of the bottoms of the trenches, the third metal layer forming a second Schottky contact with the second partial layer and a third Schottky contact with the first partial layer wherein a barrier height of the second Schottky contact is different from a barrier height of the third Schottky contact.
2. The trench Schottky diode as recited in claim 1, wherein:
   the trench Schottky diode is realized as a chip that includes a chip surface region and a lower region;
   the first partial layer and the third metal layer form the lower region;

the second partial layer and the second metal layer form the chip surface region; and a breakdown voltage of the lower region is lower than a breakdown voltage in the chip surface region.

3. The trench Schottky diode as recited in claim 2, wherein the breakdown voltage of the lower region is between 40% and 60% of the breakdown voltage in the chip surface region.

4. The trench Schottky diode as recited in claim 1, wherein the breakdown voltage resides within a range of between 20 V and 40 V.

5. The trench Schottky diode as recited in claim 1, wherein the trench Schottky diode can be operated at breakdown at current densities (j), in a range of $10^{-4}$ A/cm$^2$ ≤ j ≤ 500 A/cm$^2$.

* * * * *